United States Patent
Bedell et al.

(10) Patent No.: US 9,209,216 B2
(45) Date of Patent: Dec. 8, 2015

(54) PASSIVATION OF BACK-ILLUMINATED IMAGE SENSOR

(71) Applicant: INTERNATIONAL BUSINESS MACHINES CORPORATION, Armonk, NY (US)

(72) Inventors: Stephen W. Bedell, Wappingers Falls, NY (US); Bahman Hekmatshoartabari, White Plains, NY (US); Ghavam G. Shahidi, Pound Ridge, NY (US); Davood Shahrjerdi, White Plains, NY (US)

(73) Assignee: GLOBALFOUNDRIES INC, Grand Cayman (KY)

( * ) Notice: Subject to any disclaimer, the term of this patent is extended or adjusted under 35 U.S.C. 154(b) by 55 days.

(21) Appl. No.: 13/961,429

(22) Filed: Aug. 7, 2013

(65) Prior Publication Data
US 2015/0041936 A1 Feb. 12, 2015

(51) Int. Cl.
*H01L 27/146* (2006.01)

(52) U.S. Cl.
CPC ........ *H01L 27/1464* (2013.01); *H01L 27/1461* (2013.01); *H01L 27/1462* (2013.01); *H01L 27/14625* (2013.01); *H01L 27/14627* (2013.01); *H01L 27/14687* (2013.01)

(58) Field of Classification Search
None
See application file for complete search history.

(56) References Cited

U.S. PATENT DOCUMENTS

| | | | |
|---|---|---|---|
| 7,348,608 B2 | 3/2008 | Ko et al. | |
| 7,547,573 B2 | 6/2009 | Wen et al. | |
| 8,039,918 B2 | 10/2011 | Nakata | |
| 8,274,587 B2 | 9/2012 | Hynecek | |
| 8,278,690 B2 * | 10/2012 | Mao et al. | 257/228 |
| 8,344,431 B2 | 1/2013 | Beak et al. | |
| 2005/0074954 A1 * | 4/2005 | Yamanaka | 438/458 |
| 2005/0139828 A1 * | 6/2005 | Maruyama et al. | 257/59 |
| 2006/0076590 A1 * | 4/2006 | Pain et al. | 257/294 |
| 2009/0020700 A1 | 1/2009 | Braunstein et al. | |
| 2009/0174018 A1 * | 7/2009 | Dungan et al. | 257/432 |
| 2010/0167453 A1 * | 7/2010 | Kim et al. | 438/65 |
| 2010/0307572 A1 | 12/2010 | Bedell et al. | |
| 2011/0128429 A1 * | 6/2011 | Endo et al. | 348/308 |

(Continued)

FOREIGN PATENT DOCUMENTS

KR 20140112793 A 9/2014

OTHER PUBLICATIONS

Non-Final Office Action issued in U.S Appl. No. 14/020,473 on Dec. 24, 2014. (9 Pages).
Joy, T., et al. "Development of a Production-Ready, Back-Illuminated CMOS Image Sensor With Small Pixels" IEEE International on Electron Devices Meeting, 2007. IEDM 2007. Dec. 2007. pp. 1007-1010.

(Continued)

*Primary Examiner* — Michael Lebentritt
*Assistant Examiner* — Jordan Klein
(74) *Attorney, Agent, or Firm* — Tutunjian & Bitetto, P.C.

(57) ABSTRACT

A method for forming a back-illuminated image sensor includes forming a higher doped crystalline layer on a crystalline substrate, growing a lower doped crystalline layer on the higher doped crystalline layer and forming a photodiode and component circuitry from the lower doped crystalline layer. Metallization structures are formed to make connections to and between components. The crystalline substrate is removed to expose the higher doped crystalline layer. An optical component structure is provided on an exposed surface of the higher doped crystalline layer to receive light therein such that the higher doped crystalline layer provides a passivation layer for the photodiode and the component circuitry.

13 Claims, 9 Drawing Sheets

(56) References Cited

U.S. PATENT DOCUMENTS

| | | | |
|---|---|---|---|
| 2013/0105928 A1* | 5/2013 | Costello et al. | 257/432 |
| 2013/0193540 A1* | 8/2013 | Liao et al. | 257/432 |
| 2013/0193547 A1* | 8/2013 | Nakazawa | 257/443 |
| 2013/0248954 A1* | 9/2013 | Ahn | 257/292 |
| 2014/0264695 A1* | 9/2014 | Lee et al. | 257/432 |

OTHER PUBLICATIONS

Prima, J., et al. "A 3Mega-Pixel Back-Illuminated Image Sensor in 1T5 Architecture With 1.45UM Pixel Pitch" 2007 International Image Sensor Workshop. Jun. 2007. pp. 5-8.

* cited by examiner

PASSIVATION OF BACK-ILLUMINATED IMAGE SENSOR

BACKGROUND

1. Technical Field

The present invention relates to image sensing devices and methods, and more particularly to a back-illuminated photosensitive device having optical components wafer bonded to a passivation layer.

2. Description of the Related Art

Complementary metal oxide semiconductor (CMOS) image sensors are widely used for making high density or high resolution arrays of photodetectors. These image sensors are, in principle, classified into two categories depending on the direction that the incident light hits the sensor. These include a front-illuminated sensor and a back-illuminated sensor. It is commonly known that the back-illuminated architecture permits the implementation of a photodetector array with higher density and improved performance compared to the front-illuminated architecture. Reflectance of incident light from a metal interconnect surface limits the performance of the front-illuminated architecture due to cross-talk amongst individual cells and attenuation of the incident light intensity. Moreover, the presence of several levels of metal interconnect further tends to restrict the areal density of the image sensor array. As a result, the back-illuminated architecture is preferred to alleviate the shortcomings of the front-illuminated image sensor structure.

SUMMARY

A method for forming a back-illuminated image sensor includes forming a higher doped crystalline layer on a crystalline substrate, growing a lower doped crystalline layer on the higher doped crystalline layer and forming a photodiode and component circuitry from the lower doped crystalline layer. Metallization structures are formed to make connections to and between components. The crystalline substrate is removed to expose the higher doped crystalline layer. An optical component structure is provided on an exposed surface of the higher doped crystalline layer to receive light therein such that the higher doped crystalline layer provides a passivation layer for the photodiode and the component circuitry.

Another method for forming a back-illuminated image sensor includes forming a lower doped crystalline layer on a crystalline substrate; forming a photodiode and component circuitry from the lower doped crystalline layer; forming metallization structures to make connections to and between components; removing the crystalline substrate to expose the photodiode and the component circuitry on the lower doped crystalline layer; growing and patterning a higher doped hydrogenated crystalline layer on an exposed surface of the photodiode and the component circuitry on the lower doped crystalline layer; and providing an optical component structure on the higher doped crystalline layer to receive light therein such that the higher doped crystalline layer provides a passivation layer for at least one of the photodiode and the component circuitry.

A back-illuminated image sensor includes at least one photodiode, component circuitry and metallization structures to make connections to and between components. A doped crystalline passivation layer is formed on the photodiode and the component circuitry and has a dopant concentration higher than that of a substrate of the photodiode. An optical component structure is formed on the passivation layer such that the photodiode receives light through the optical component and the passivation layer wherein the passivation layer passivates at least one of the photodiode and the component circuitry.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
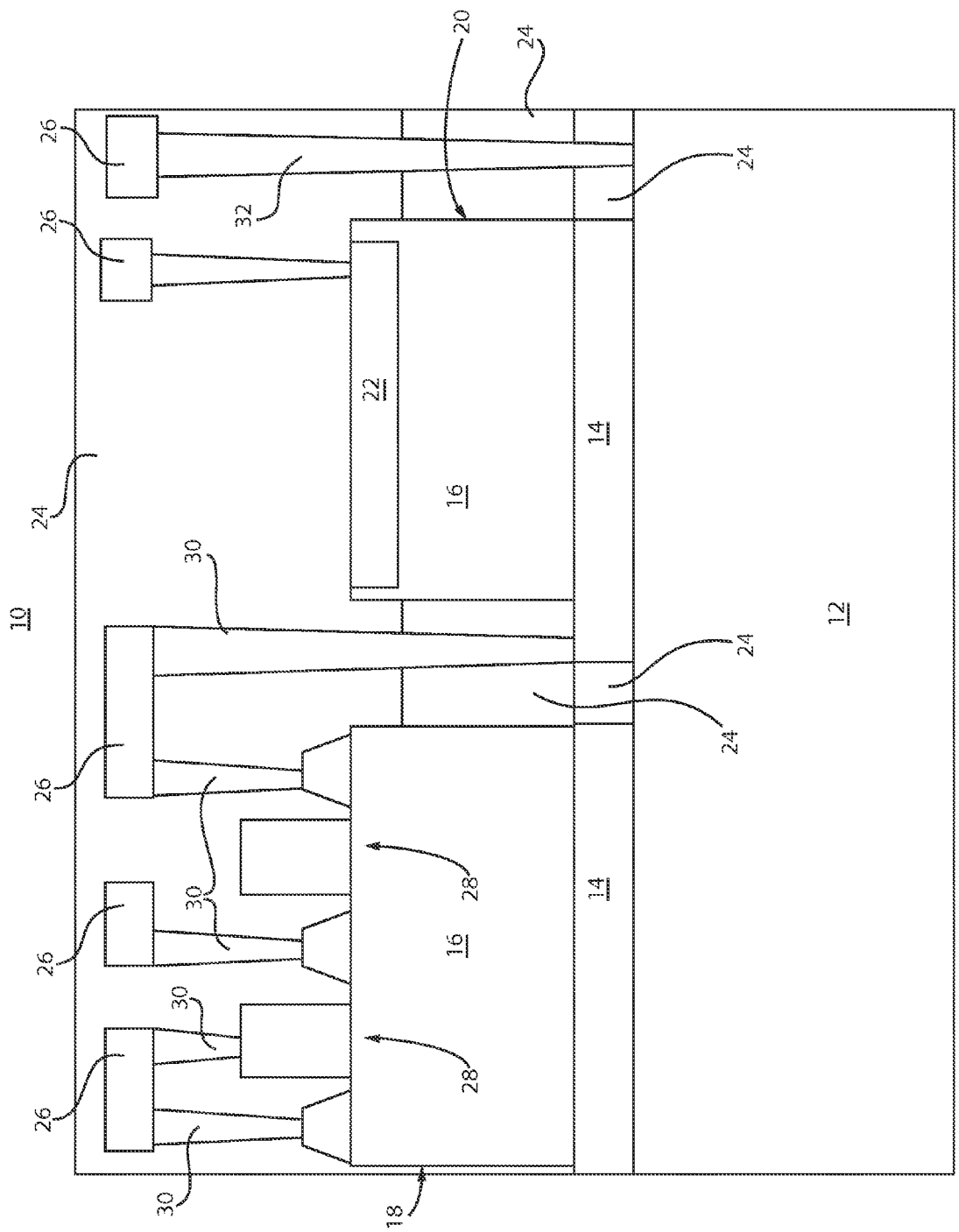
FIG. 1 is a cross-sectional view of a partially fabricated back-illuminated image sensor having a passivation layer formed on a substrate in accordance with the present principles.

In accordance with the present principles, a new image sensor structure is provided on bulk substrate (e.g., Si). The bulk substrate includes an epitaxially grown layer for forming readout circuitry, photodiodes and other components or circuitry, and an embedded highly doped region that provides an etch stop layer when the bulk substrate is to be removed. The bulk substrate can be removed by a controlled spalling, chemical-mechanical polishing (CMP), etching, grinding, etc., or combinations thereof. Back-illuminated image sensors are made by separating the image-sensor and the readout circuitry from the original bulk substrate and/or thinning the original bulk substrate using polishing methods.

Leaving the surface of the epitaxially grown layer exposed and unpassivated could compromise device performance, as a result of increased surface recombination velocity at this surface. In accordance with one embodiment, a low-temperature highly-doped epitaxially grown layer is formed on the exposed surface for passivating this surface. The low-temperature epitaxial hydrogenated silicon is preferably grown at temperatures below 400 degrees C., compatible with back-end of the line (BEOL) processing temperatures. A feature of the hydrogenated crystalline silicon layer is its hydrogen content, ranging from about 5 to about 40 atomic percent. The growth process preferably includes a plasma enhanced chemical vapor deposition (PECVD). Then, a color filter, lenses and/or other components are wafer bonded to the passivation layer.

It is to be understood that the present invention will be described in terms of a given illustrative architecture having a wafer or substrate architectures; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

In accordance with the present principles, a design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The present embodiments may be part of a photovoltaic device or circuit, and the circuits as described herein may be part of a design for an integrated circuit chip, a solar cell, a light sensitive device, a display device, etc.

Reference in the specification to "one embodiment" or "an embodiment" of the present principles, as well as other varia-tions thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a cross-sectional view of a partially fabricated photosensor device 10 is shown in accordance with one illustrative embodiment. A bulk substrate 12 may include monocrystalline Si, or other suitable substrate material, e.g., semiconductor-on-insulator (SOI), etc. A crystalline etch stop layer 14 is formed on the substrate 12. The etch stop layer 14 may include Si, SiGe, or other suitable materials. The etch stop layer 14 may be heavily doped (e.g., with p+ dopants, such as, boron) during formation of the layer 14. Layer 14 may be patterned to create separate islands of materials for forming components as will be described.

A lightly doped (e.g., p doped) component layer 16 is grown on the etch stop layer 14. The component layer 16 is patterned to form readout circuitry 18 and a photodiode 20. Other circuits and components may also be formed. The component layer 16 may include Si, SiGe or other suitable material. A top portion of the photodiode 20 may be doped (e.g., n+ doped, such as, phosphorus or arsenic) to form a doped region 22 to complete the photodiode 20. The n+ doped region is formed through either an ion implantation process or an epitaxial growth process.

Dielectric layers 24 are formed and patterned to deposit conductive material therein to form contacts 30 and metal lines 26. The dielectric layers 24 may include silicon dioxide or other suitable dielectric materials that will passivate the surface of the n+ doped 22 region. The contacts 30 connect to readout devices 28 (e.g., transistors), regions 14 and 22, etc. Other contacts 32 are provided, which can make connections to other components at a surface of the device 10, e.g., for flip chip bonding and packaging, as will be described hereinafter.

Figure 2:
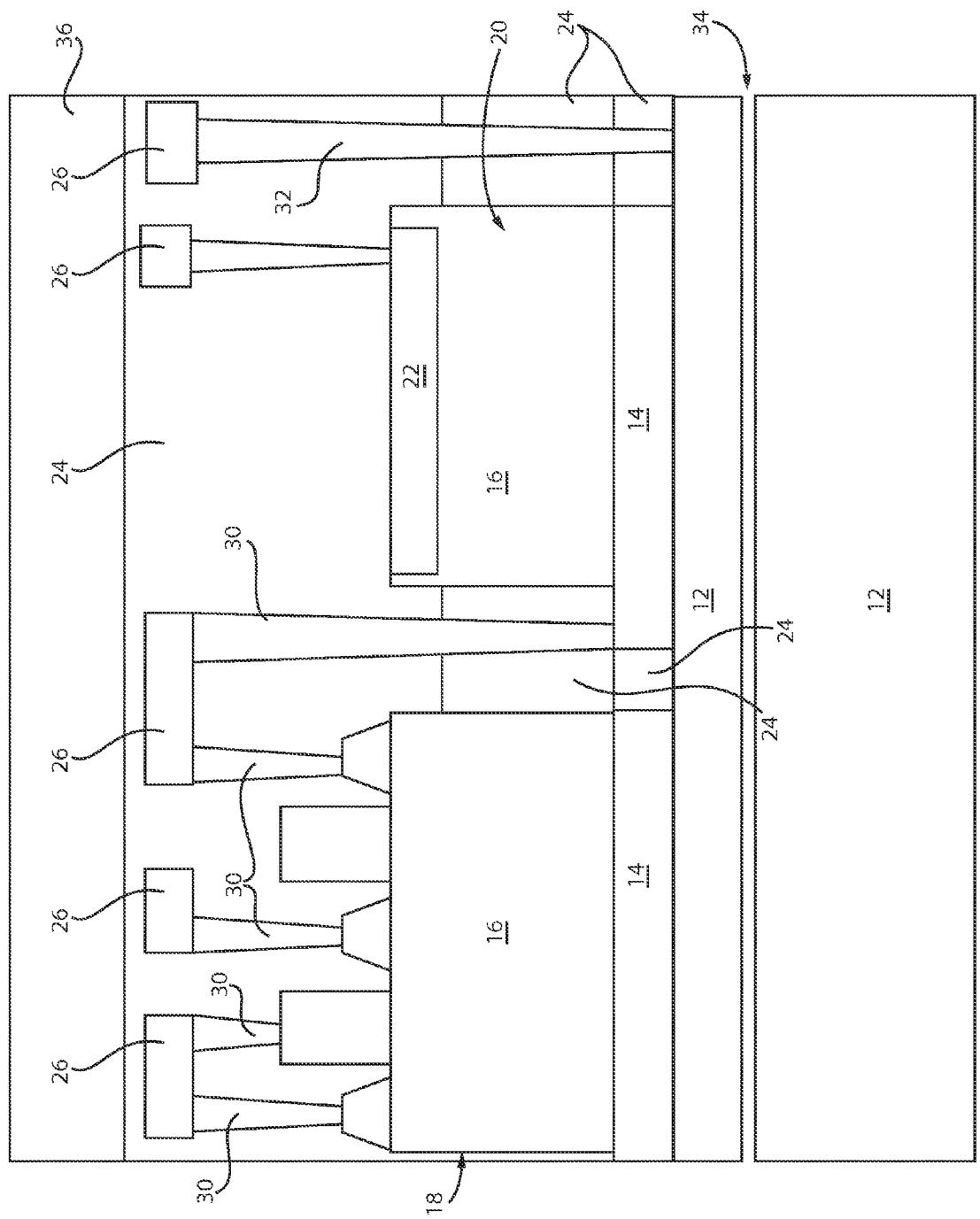
FIG. 2 is a cross-sectional view of the partially fabricated back-illuminated image sensor of FIG. 1 having the substrate removed in accordance with the present principles.

Referring to FIG. 2, the bulk substrate 12 needs to be reduced in thickness. This may be performed by employing a spalling process, a smart cut process, a cleaving process, an etch process, a grinding process, a chemical mechanical polish (CMP), etc. or combinations of these processes. Prior to reducing the substrate 12, a handle or support substrate 36 is adhered or bonded to a top surface of the dielectric layer 24. The support substrate 36 may include any useful material, e.g., a polymer, glass, a semiconductor, a metal, etc.

In one useful embodiment, a spalling process is employed to split the substrate 12 along a fracture line or layer 34. A fracture layer may be created into the substrate 12 (e.g., by forming a compressively strained layer between the substrate 12 and the layer 14). After spalling or smart cutting, the exposed surface of the substrate 12 in contact with the etch stop layer 14 may be further reduced by etching or polishing (e.g., CMP) and stopping on the etch stop layer 14.

Figure 3:
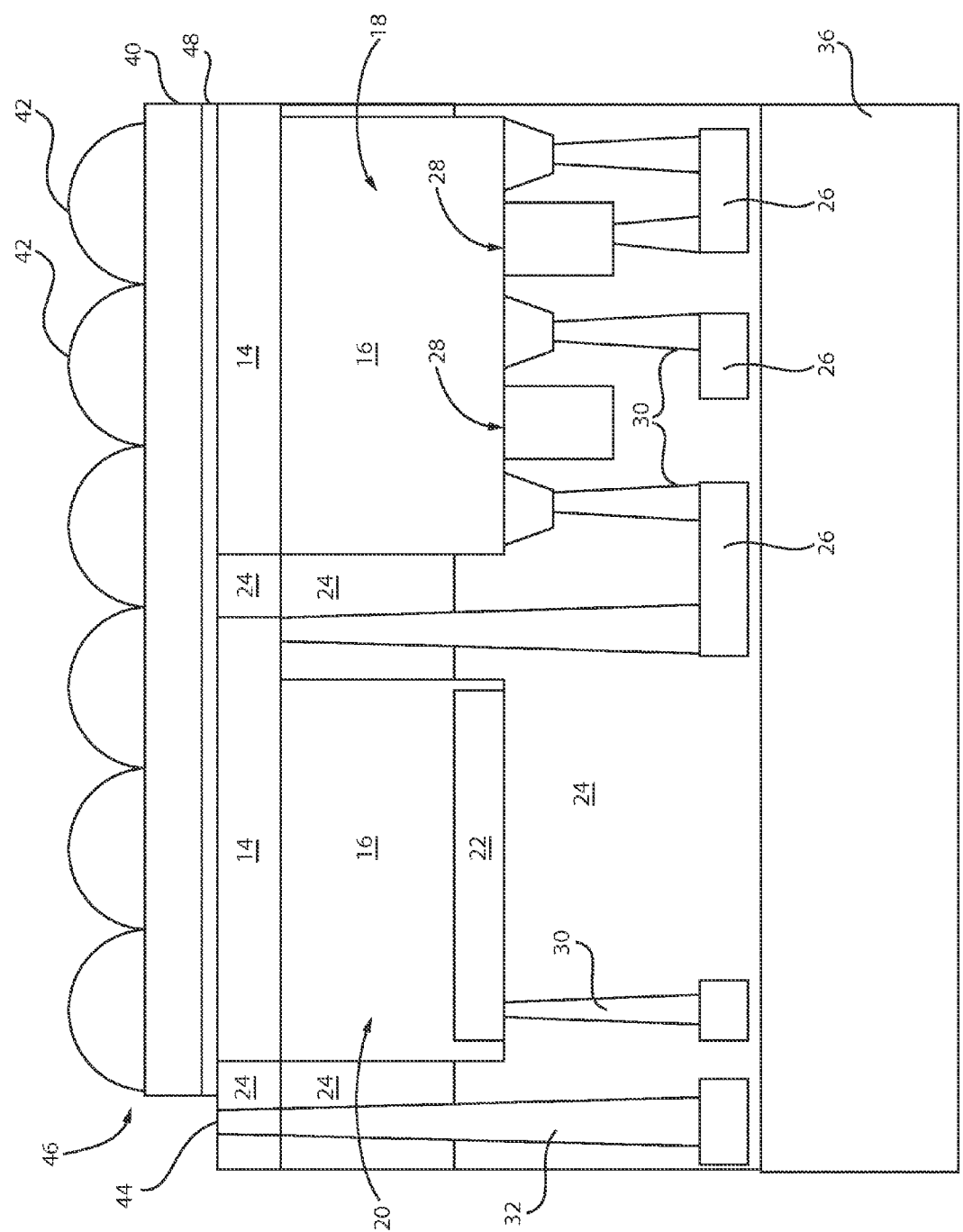
FIG. 3 is a cross-sectional view of the fabricated back-illuminated image sensor of FIG. 2 having an optical component structure (wafer) provided or formed on the passivation layer in accordance with the present principles.

Referring to FIG. 3, after the removing of the bulk substrate 12, the device 10 is wafer bonded to an optical component wafer 46. The optical component wafer 46 may include a filter layer 40 that may include color filters or additional passivation layers employed for the photodiode 20 and microlenses 42 or other optical collection features. In another embodiment, the filter layer 40 and the microlenses 42 may be formed directly on layer 14. Filter layer 40 may include one or more additional passivation layers 48, which may include one or more of hydrogenated amorphous Si (a-Si:H) (doped or undoped), a low-temperature oxide, a low temperature nitride or other suitable material such as atomic layer deposited (ALD) $Al_2O_3$, etc. Contact 32 remains exposed and may be employed to enable a connection for flip bonding packaging.

Figure 4:
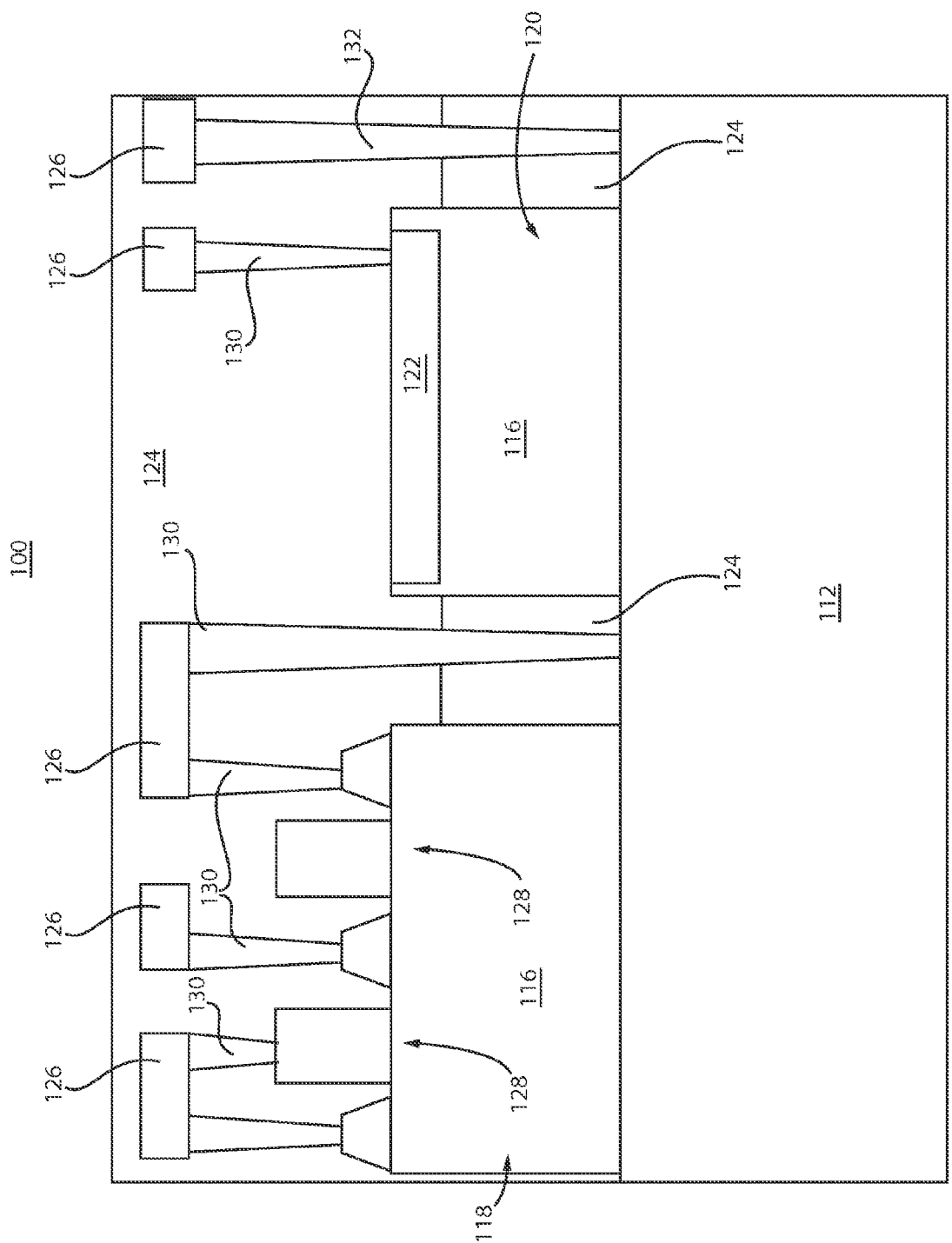
FIG. 4 is a cross-sectional view of a partially fabricated back-illuminated image sensor having component substrates formed on a bulk substrate in accordance with the present principles.

Referring to FIG. 4, a cross-sectional view of a partially fabrication photosensor device 100 is shown in accordance with another illustrative embodiment. A bulk substrate 112 may include monocrystalline Si, or other suitable substrate material, e.g., semiconductor-on-insulator, etc. A lightly doped (e.g., p doped) component layer 116 is grown on the substrate 112 without a heavily doped etch stop layer (14) as before. The component layer 116 is patterned to form readout circuitry 118 and a photodiode 120. Alternatively, the p-active regions may be formed by patterning the bulk silicon substrate and separating the regions using isolation processes such as shallow trench isolation. Other circuits and components may also be formed. The component layer 116 may include Si, SiGe or other suitable material. The top portion of the photodiode 120 may be doped (e.g., n+ doped) to form a doped region 122 to complete the photodiode 120.

Dielectric layers 124 are formed and patterned to deposit conductive material therein to form contacts 130 and metal lines 126. The dielectric layers 124 may include silicon dioxide or other suitable dielectric materials. The contacts 130 connect to readout devices 128 (e.g., transistors), region 122, etc. Other contacts 132 are provided, which can make connections to other components at a surface of the device 100, as will be described hereinafter.

Figure 5:
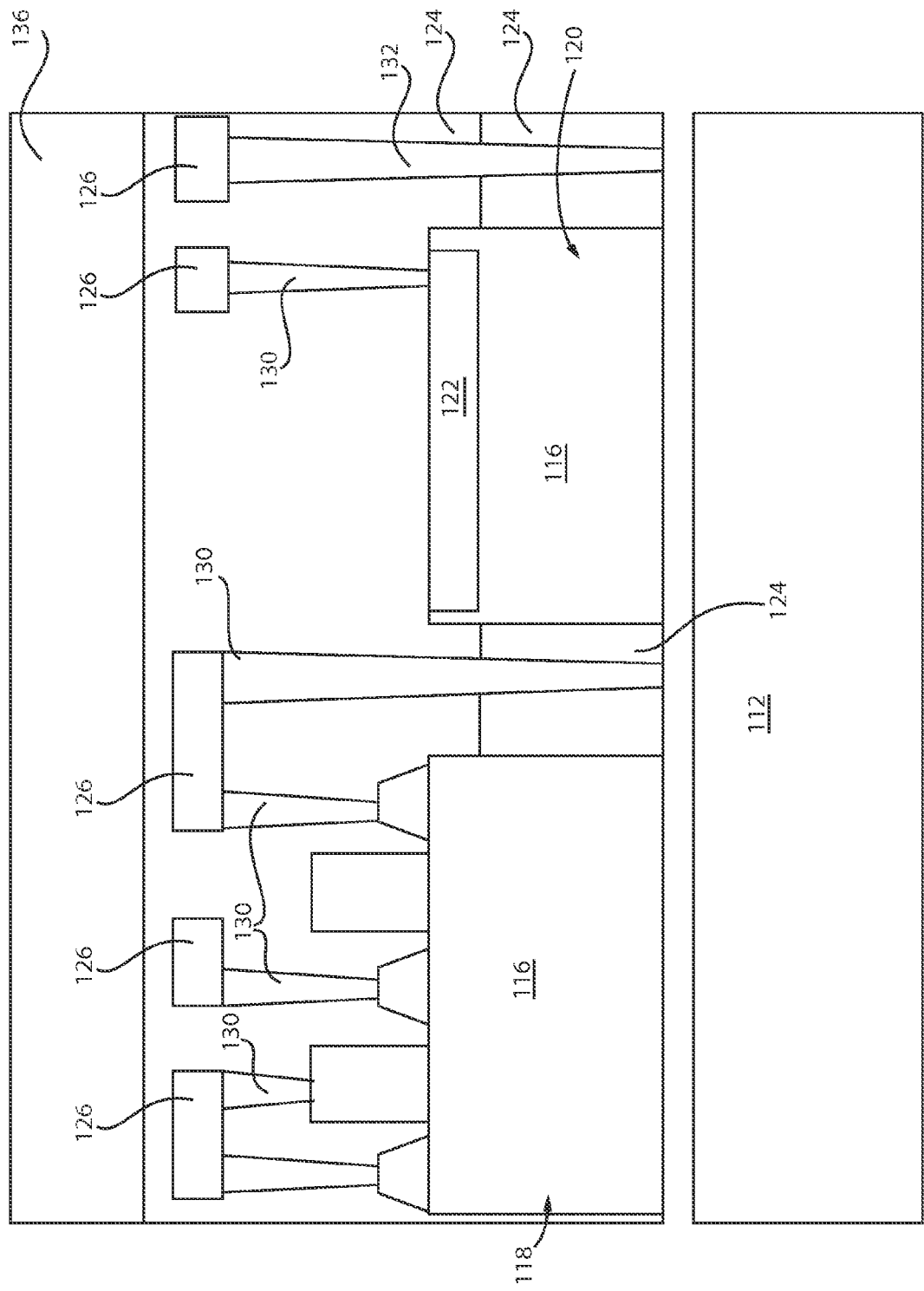
FIG. 5 is a cross-sectional view of the partially fabricated back-illuminated image sensor of FIG. 4 having the substrate removed in accordance with the present principles.

Referring to FIG. 5, the bulk substrate 112 needs to be reduced in thickness and eliminated completely. This may be performed by employing a spalling process, a smart cut process, a cleaving process, an etch process, a grinding process, a chemical mechanical polish (CMP), etc. or combinations of these processes. Prior to reducing the substrate 112, a handle or support substrate 136 is adhered or bonded to a top surface of the dielectric layer 124. The support substrate 136 may include any useful material, e.g., a polymer, glass, a semiconductor, a metal, etc.

In one useful embodiment, a spalling process is employed to split the substrate 112 along an interface line with layer 116. Further reduction in the substrate 112 may be done by etching or polishing (e.g., CMP).

Figure 6:
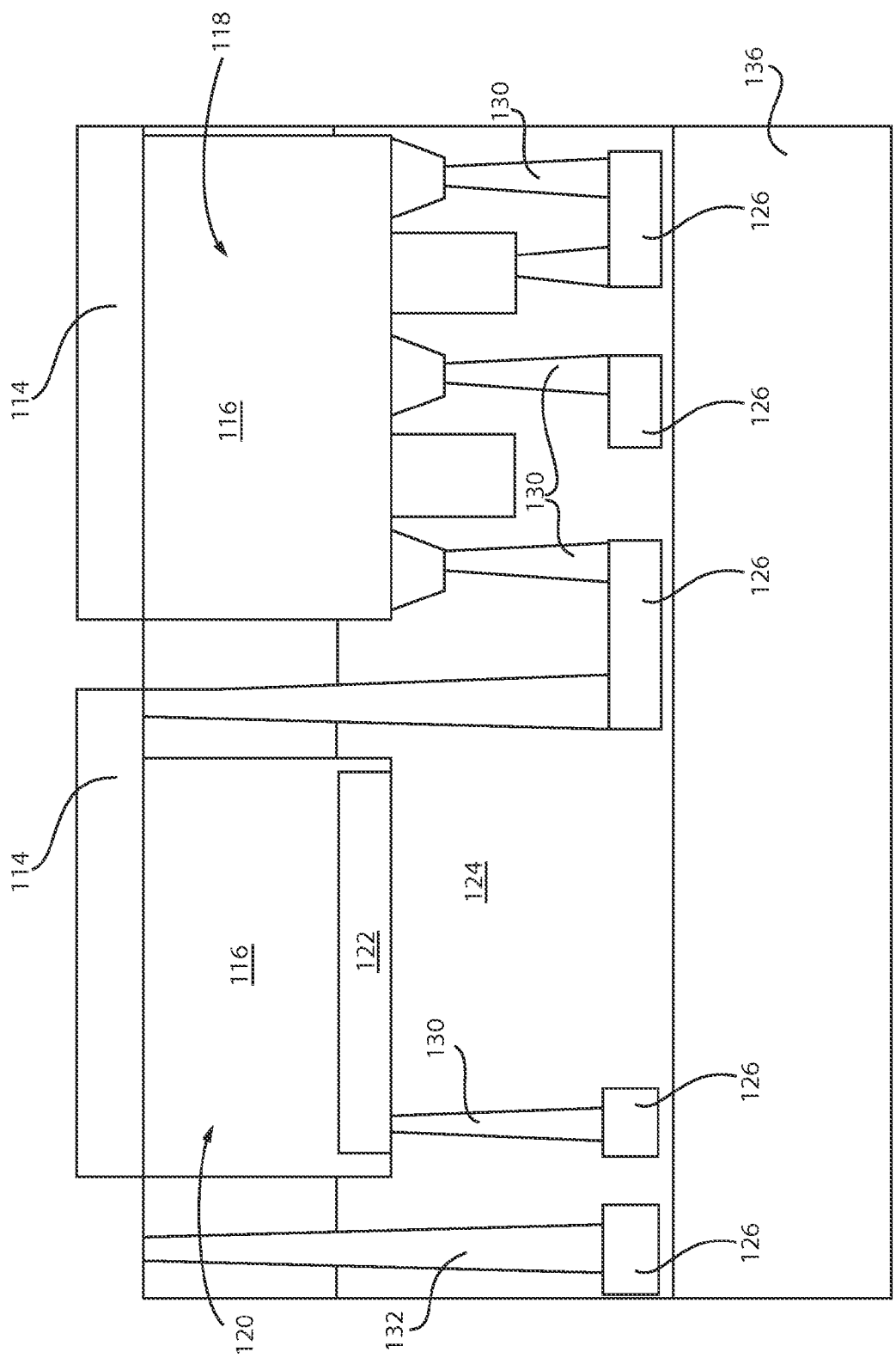
FIG. 6 is a cross-sectional view of the fabricated back-illuminated image sensor of FIG. 5 having a passivation layer formed on the component substrates in accordance with the present principles.

Referring to FIG. 6, after the removing of the bulk substrate 112, the surface of layer 116 is exposed. An epitaxial growth process is employed to form a crystalline layer 114. The crystalline layer 114 may be patterned to form hi-lo or floating junctions with material of layer 116 (depending the doping type of the 116 layer) and to passivate the back surface of layer 116. The layer 114 is highly doped hydrogenated crystalline silicon (e.g., n+c-Si:H) and include between about 5 and about 40 atomic % hydrogen. The epitaxial growth process for forming layer 114 may include a low temperature plasma enhanced chemical vapor deposition (PECVD) process. The PECVD process is preferably performed at a temperature compatible with back end of the line (BEOL) processing, e.g., less than about 400 degrees C., and more preferably between about 150 degrees C. and 250 degrees C. By employing, the epitaxial layer 114 passivation dark current of the 120 photodiodes will be significantly improved. The low temperature process protects against thermal damage to the photodiode substrate 116 and other previously formed components.

Figure 7:
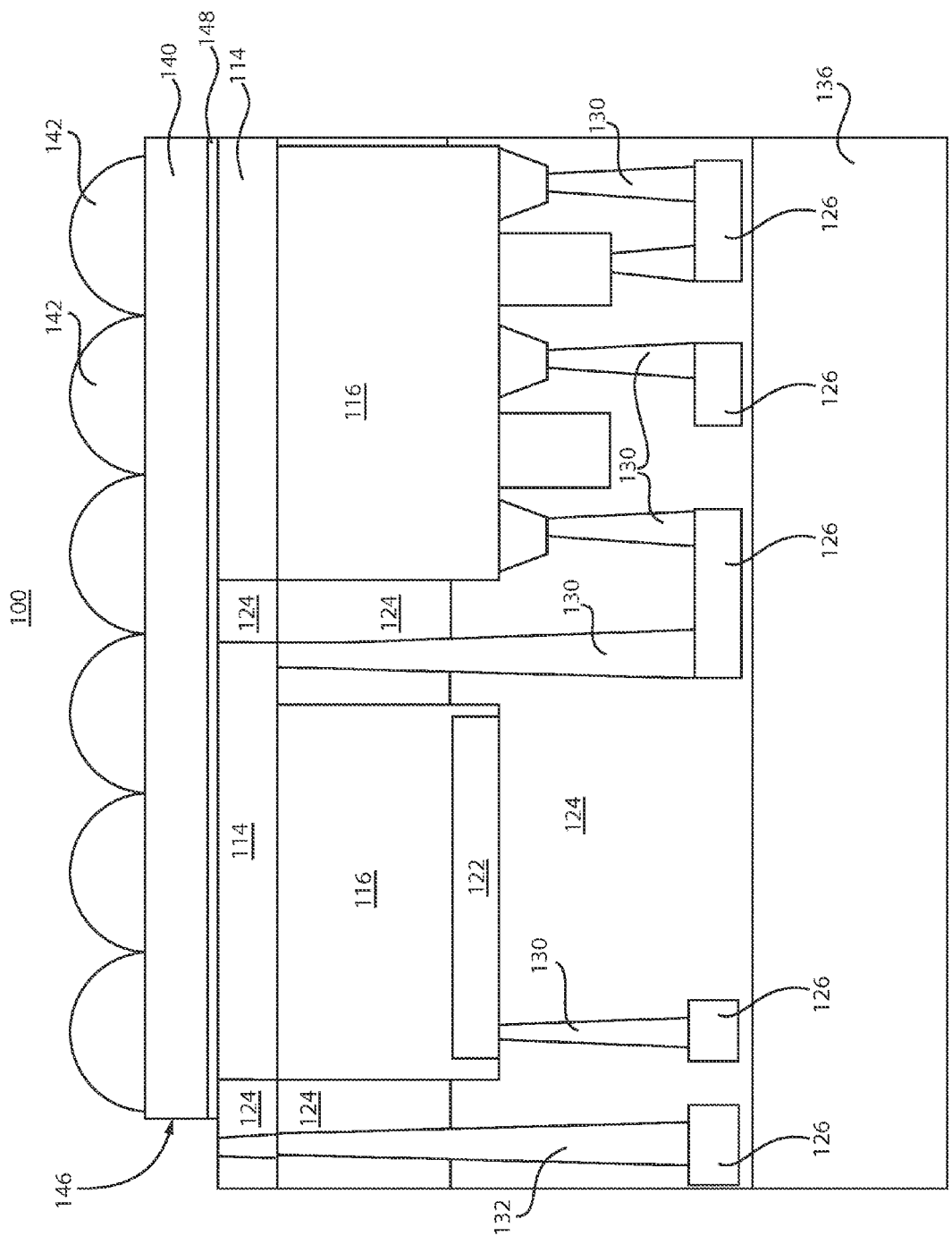
FIG. 7 is a cross-sectional view of the fabricated back-illuminated image sensor of FIG. 6 having an optical component structure (wafer) provided or formed on the passivation layer in accordance with the present principles.

Referring to FIG. 7, the device 100 is wafer bonded to an optical component wafer 146. The optical component wafer 146 may include a filter layer 140 that may include color filters or additional passivation layers employed for the photodiode 120 and microlenses 142 or other optical collection features. In another embodiment, the filter layer 140 and the microlenses 142 may be formed directly on layer 114. Filter layer 140 may include one or more additional passivation layers 148, which may include one or more of hydrogenated amorphous Si (a-Si:H) (doped or undoped) layers, a low-temperature oxide, a low temperature nitride or other suitable material. Contact 132 needs to be extended to reach the end of layer 114. Dielectric material 124 may be deposited to fill in spaces between islands of layer 114 and to provide an area to form a via to extend contacts 132 so that the contact 132 remains exposed and may be employed to enable a connection for flip bonding packaging.

Excellent passivation is achieved using layers 14 and 114. When the highly doped passivation layer 14, 114 includes a same doping conductivity type as the photodiode substrate 16, 116, minority carriers are repelled (back surface field). When the highly doped passivation layer 14, 114 includes a different doping conductivity type as the photodiode substrate 16, 116, an electrically floating layer (floating junction) is formed.

In one embodiment, a back surface field type stack (FIG. 3) with layer 14 (e.g., $n^+$ c-Si:H) having a thickness between about 5 nm and about 100 nm with an activated doping level of between $1\times10^{18}$ cm$^{-3}$ to $1\times10^{20}$ cm$^{-3}$, more preferably about of $5\times10^{19}$ cm$^{-3}$ provided the best passivation. In another embodiment, a floating junction (FIG. 7) with layer 114 (e.g., $n^+$ c-Si:H) having a thickness between about 3 nm and about 100 nm with an activated doping level of between $1\times10^{18}$ cm$^{-3}$ to $1\times10^{20}$ cm$^{-3}$, more preferably about of $5\times10^{19}$ cm$^{-3}$ provided the best passivation.

Figure 8:
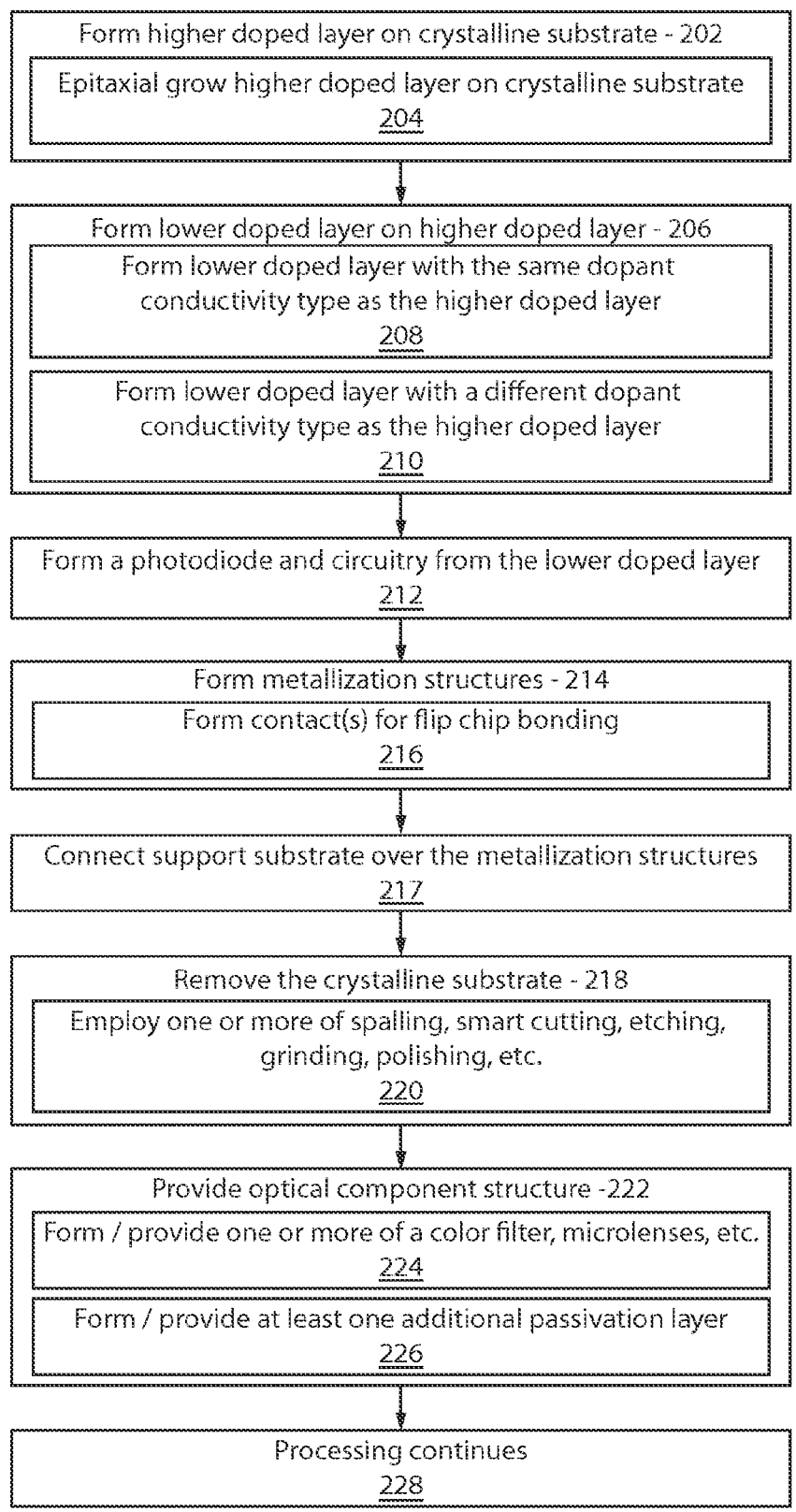
FIG. 8 is a block/flow diagram showing a method for fabricating a back-illuminated image sensor in accordance with one illustrative embodiment.
Figure 9:
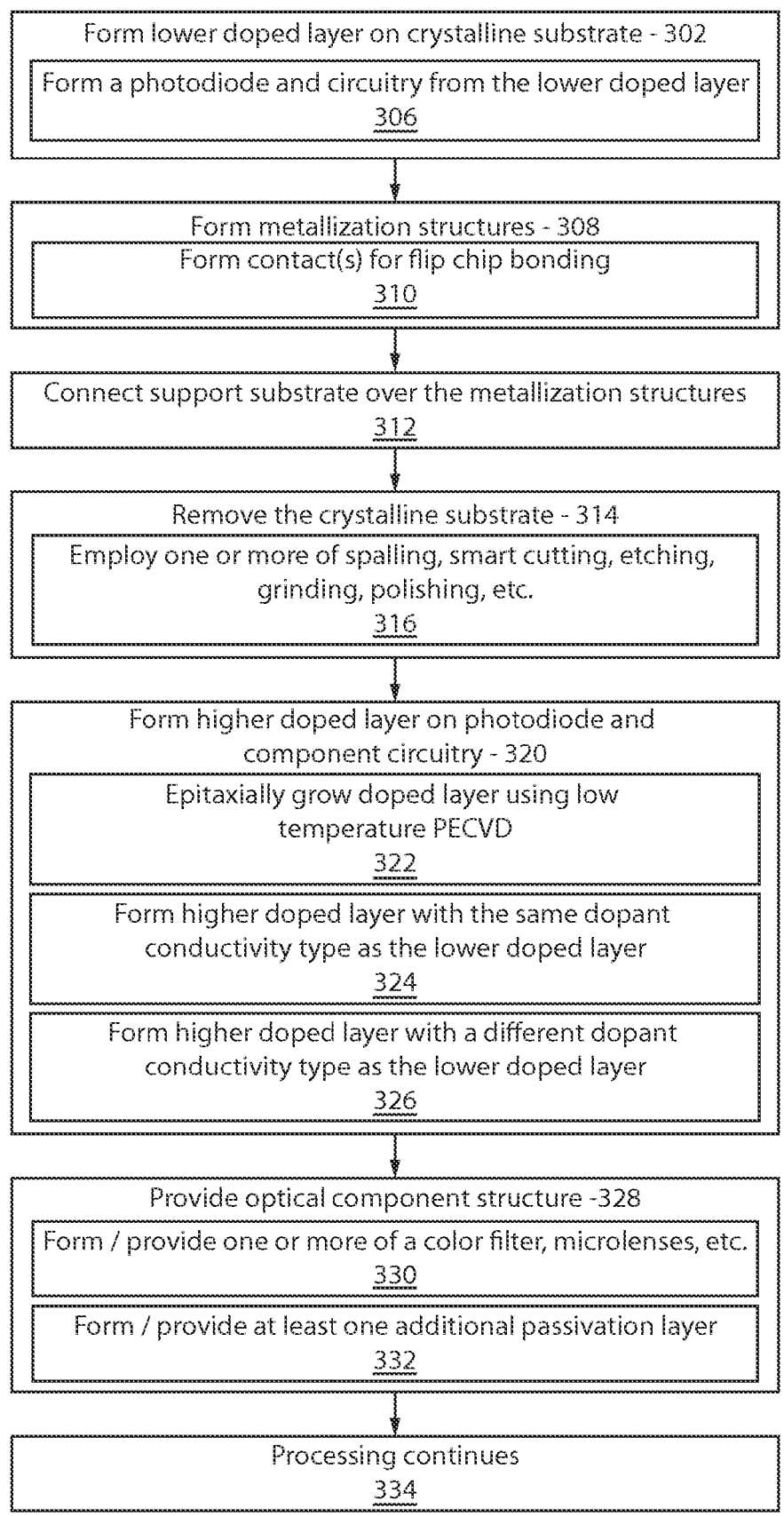
FIG. 9 is a block/flow diagram showing another method for fabricating a back-illuminated image sensor in accordance with another illustrative embodiment.

It should be noted that, in some alternative implementations, the functions noted in the blocks may occur out of the order noted in FIGS. 8 and 9. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Referring to FIG. 8, a method for forming a back-illuminated image sensor is illustratively shown. In block 202, a higher doped crystalline layer is formed on a crystalline substrate. In block 204, the higher doped crystalline layer is preferably p+ doped to serve as an etch stop and provide field-assisted passivation of the surface of the image sensor.

In block 206, a lower doped crystalline layer is formed on the higher doped crystalline layer. In block 208, the higher doped crystalline layer may have a same doping conductivity type as the lower doped crystalline layer, to repel minority carriers away from the interface. In block 210, the higher doped crystalline layer may include a different doping conductivity type from the lower doped crystalline layer to form an electrically floating layer. In block 212, a photodiode and component circuitry are formed from the lower doped crystalline layer.

In block 214, metallization structures are formed to make connections to and between components. In block 216, a contact or contacts may be formed to a surface of the higher doped crystalline layer to provide a connection for flip chip bonding.

In block 217, a support substrate may be connected to the device on a front side (opposite the passivation layer). In block 218, the crystalline substrate is removed to expose the higher doped crystalline layer. In block 220, the crystalline substrate is removed by at least one of: smart cutting, spalling, grinding, polishing and etching the substrate, or a combination thereof.

In block 222, an optical component structure is provided on an exposed surface of the higher doped crystalline layer to receive light therein such that the higher doped crystalline layer provides a passivation layer for at least one of the photodiode and the component circuitry. In block 224, the optical component structure may include at least one of a color filter layer and a layer of microlenses. In block 226, the optical component structure may include at least one additional passivation layer on the higher doped crystalline layer. In block 228, processing continues, as needed.

Referring to FIG. 9, another method for forming a back-illuminated image sensor is illustratively shown. In block 302, a low doped crystalline layer is formed on a crystalline substrate. In block 306, a photodiode and component circuitry are formed from the low doped crystalline layer. In block 308, metallization structures are formed to make connections to and between components. In block 310, a contact or contacts may be formed to a surface of the higher doped crystalline layer to provide a connection for flip chip bonding. In block 312, a support substrate may be connected to the device on a front side (opposite the passivation layer).

In block 314, the crystalline substrate is removed to expose the photodiode and the component circuitry on the lower doped crystalline layer. In block 316, the crystalline substrate is removed by at least one of: smart cutting, spalling, grinding, and etching the substrate, or a combination thereof.

In block 320, a higher doped hydrogenated crystalline layer is grown and patterned on an exposed surface of the photodiode and the component circuitry on the lower doped crystalline layer. In block 322, the higher doped crystalline layer is epitaxially grown using a plasma enhanced chemical vapor deposition process at a temperature below 400 degrees C. The higher doped crystalline layer preferably includes Si with between 5-40 atomic % hydrogen. In block 324, the higher doped crystalline layer may include a different doping conductivity type from the lower doped crystalline layer to form an electrically floating layer. In block 326, the higher doped crystalline layer may include a different doping conductivity type from the lower doped crystalline layer to form an electrically floating layer.

In block 328, an optical component structure is provided on the higher doped crystalline layer to receive light therein such that the higher doped crystalline layer provides a passivation layer for at least one of the photodiode and the component circuitry. In block 330, the optical component structure may include at least one of a color filter layer and a layer of microlenses. In block 332, the optical component structure may include at least one additional passivation layer on the higher doped crystalline layer. In block 334, processing continues, as needed.

Having described preferred embodiments for passivation of back-illuminated image sensor (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a back-illuminated image sensor, comprising:
    forming a higher doped crystalline layer on a crystalline substrate;
    growing a lower doped crystalline layer on the higher doped crystalline layer;
    forming a photodiode and component circuitry including patterning the lower doped crystalline layer;
    forming metallization structures to make connections to and between components;
    removing the crystalline substrate to expose the higher doped crystalline layer; and
    providing an optical component structure on an exposed surface of the higher doped crystalline layer to receive light therein such that the higher doped crystalline layer provides a passivation layer for at least one of the photodiode and the component circuitry.

2. The method as recited in claim 1, wherein forming the higher doped crystalline layer on the crystalline substrate includes epitaxially growing the higher doped crystalline layer from in-situ doped Si.

3. The method as recited in claim 1, wherein the higher doped crystalline layer includes a same doping conductivity type as the lower doped crystalline layer to repel minority carriers.

4. The method as recited in claim 1, wherein the higher doped crystalline layer includes a different doping conductivity type from the lower doped crystalline layer to form an electrically floating layer.

5. The method as recited in claim 1, wherein the higher doped crystalline layer acts as an etch stop layer.

6. The method as recited in claim 1, wherein forming metallization structures includes forming a contact to a surface of the higher doped crystalline layer to provide a connection for flip chip bonding.

7. The method as recited in claim 1, wherein removing the crystalline substrate includes at least one of: smart cutting, spalling, grinding, and etching the substrate.

8. The method as recited in claim 1, wherein providing an optical component structure includes at least one of a color filter layer and a layer of microlenses.

9. The method as recited in claim 1, wherein providing an optical component structure includes forming at least one additional passivation layer on the higher doped crystalline layer.

10. The method as recited in claim 1, further comprising forming a support substrate and a dielectric material, the dielectric material disposed between the support substrate and the optical component structure.

11. The method as recited in claim 10, wherein forming the metallization structures include tapered contacts having a larger thickness closer to the support substrate and a thinner thickness closer to the optical component structure.

12. The method as recited in claim 1, wherein the higher doped crystalline layer includes a photodiode portion and a component circuitry portion separated to form a gap.

13. The method as recited in claim 12, further comprising forming a dielectric material in the gap between the photodiode and component circuitry portions of the higher doped crystalline layer.

* * * * *